US006852605B2

United States Patent
Ng et al.

(12) United States Patent
(10) Patent No.: US 6,852,605 B2
(45) Date of Patent: Feb. 8, 2005

(54) METHOD OF FORMING AN INDUCTOR WITH CONTINUOUS METAL DEPOSITION

(75) Inventors: Chit Hwei Ng, Singapore (SG); Lap Chan, Singapore (SG); Purakh Verma, Singapore (SG); Yelehanka Ramachandramurthy Pradeep, Singapore (SG); Sanford Chu, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/427,287

(22) Filed: May 1, 2003

(65) Prior Publication Data

US 2004/0217440 A1 Nov. 4, 2004

(51) Int. Cl.[7] ............................................... H01L 21/20
(52) U.S. Cl. ...................... 438/381; 438/627; 438/637; 438/643
(58) Field of Search ................................ 438/381, 622, 438/623, 627, 637, 643

(56) References Cited

U.S. PATENT DOCUMENTS

| | | | | |
|---|---|---|---|---|
| 6,187,647 B1 | | 2/2001 | Chu | 438/381 |
| 6,201,287 B1 | | 3/2001 | Forbes | 257/528 |
| 6,271,116 B1 | * | 8/2001 | Lou | 438/623 |
| 6,309,922 B1 | | 10/2001 | Liu et al. | 438/238 |
| 6,329,234 B1 | | 12/2001 | Ma et al. | 438/210 |
| 6,514,844 B1 | * | 2/2003 | Martin et al. | 438/597 |
| 2002/0048942 A1 | * | 4/2002 | Yamaguchi | 438/672 |

* cited by examiner

Primary Examiner—Amir Zarabian
Assistant Examiner—Christy Novacek
(74) Attorney, Agent, or Firm—George O. Saile; Rosemary L.S. Pike

(57) ABSTRACT

A method is described to fabricate RF inductor devices on a silicon substrate. Low-k or other dielectric material is deposited and patterned to form inductor lower plate trenches. Trenches are lined with barrier film such as TaN, filled with copper, and excess metal planarized using chemical mechanical polishing (CMP). Second layer of a dielectric material is deposited and patterned to form via-hole/trenches. Via-hole/trench patterns are filled with barrier material, and the dielectric film in between the via-hole/trenches is etched to form a second set of trenches. These trenches are filled with copper and planarized. A third layer of a dielectric film is deposited and patterned to form via-hole/trenches. Via-hole/trenches are then filled with barrier material, and the dielectric film between via-hole/trench patterns etched to form a third set of trenches. These trenches are filled with copper metal and excess metal removed by CMP to form said RF inductor.

17 Claims, 5 Drawing Sheets

*Coil shaped*

*OPmega shaped*

*Square Spiral Shaped*

METHOD OF FORMING AN INDUCTOR WITH CONTINUOUS METAL DEPOSITION

BACKGROUND OF THE INVENTION (1) Field of the Invention

The present invention relates generally to a method of forming a semiconductor device, and more particularly to form a radio frequency (RF) inductor on a semiconductor substrate, using continuous metal deposition.

(2) Description of the Prior Art

Monolithic inductors built on silicon substrates are widely used in CMOS based RF circuits such as, low-noise amplifiers, voltage-controlled oscillators, and power amplifiers. One of the most important characteristics of the inductor is the quality factor Q, since it affects the performance of the RF circuits and systems. The spiral inductors implemented in the standard CMOS process, however, suffer from poor Q due to the lossy property of the CMOS substrate and thin metal layers from which the inductors are formed. In addition, the planar inductor takes up a large die area resulting in long inter-connect lines among the active and passive devices in a chip. Long interconnect lines in turn cause excess signal losses due to parasitic resistance and capacitance. The larger die area also increases the cost of the RF integrated circuit (IC).

In CMOS technology, on-chip inductors suffer from three main loss mechanisms: ohmic, capacitive, and inductive. Ohmic losses are due to current flowing through the resistance of the metal tracks. Using wider metal lines can reduce ohmic losses but will also increase the capacitive losses and will also decrease Q from the resulting larger metal-to-substrate capacitance. The displacement currents conducted by the metal-to-substrate capacitance result in capacitive losses; and the eddy currents generated by the magnetic flux penetrating into the substrate result in inductive losses.

U.S. Pat. No. 6,187,647 B1 describes a method of manufacturing lateral high-Q inductor for semiconductor devices. The method comprises of the steps of forming the bottom legs on a first substrate; depositing a second substrate layer over the first substrate; forming the pair of side legs for each loop through the second substrate layer; and forming top legs connecting pairs of side legs extending from adjacent bottom legs. The step of forming the side legs included forming a pair of vias through the second substrate layer to the bottom legs and depositing side legs in the vias. The step of forming the top legs includes forming a channel between the pairs of vias respectively communicating with the adjacent bottom legs and depositing top legs in the channels.

U.S. Pat. No. 6,201,287 B1 describes monolithic inductance-enhancing ICs, CMOS inductance-enhancing ICs, inductor assemblies, and inductance-multiplying methods. In one embodiment, a monolithic inductance—enhancing IC comprises a transistor supported by a bulk mono-crystalline silicon substrate. An inductor assembly is supported by the substrate and connected with the transistor in an inductance-enhancing circuit configuration having a Q factor greater than 10. In another embodiment, a CMOS inductance-enhancing IC includes a FET device, supported over a silicon-containing substrate and is connected to the gate. A second inductor is received within the insulation layer and connected to the source. The first and second inductors are arranged in a feedback loop, incorporating the FET device. In another embodiment, a monolithic substrate is provided on which CMOS IC is formed and includes an FET device and a pair of inductors. The configuration of the FET and the pair of inductors is such as effectively increase the inductance of one of the inductors.

U.S. Pat. No. 6,309,922 B1 describes a method of fabricating on-chip inductors and related structure. According to one embodiment, inductors are formed by patterning conductors within a dielectric in a semiconductor die. The entire dielectric layer is then subjected to blanket implantation or sputtering of high permeability material. In another embodiment, a first area of in a semiconductor die is covered with a photo-resist, while the second area includes a patterned conductor used as an inductor. The patterned conductor is also covered with photo-resist. The second area, excluding the covered patterned conductor is subjected to implantation or sputtering of high permeability material. The implantation or sputtering of high permeability material in the dielectric results in the inductors having higher inductance than they would have otherwise.

U.S. Pat. No. 6,329,234 B1 describes both a structure and a method of fabricating both copper metal-insulator-metal (MIM) capacitor and thick metal inductors, simultaneously using one mask. The process uses damascene and dual damascene trench/via process. High performance device structures formed by this invention include, parallel plate capacitor bottom metal electrodes and capacitor top metal electrodes, MIM capacitors, thick inductor metal wiring, interconnects and contact vias.

SUMMARY OF THE INVENTION

Accordingly, the main object of this invention is to describe a method of forming an inductor device on a semiconductor substrate.

It is yet another object to form an RF inductor device using a continuous metal deposition scheme.

Another objective of the invention is to describe a method to form an inductor having low resistance metal wiring.

In accordance with these objectives, an RF inductor and a method to fabricate said RF inductor device on a silicon substrate having other components are described. On silicon substrate, having other device components, low-k material film is deposited and patterned to form inductor lower plate trenches. Trenches are then lined with barrier films such as TaN, filled with copper metal and the excess metal is planarized using chemical mechanical polishing. Another layer of a inter-level dielectric film such as low-k material is deposited and patterned to form via-hole or trenches. These via-hole/trench patterns are lined with barrier material, and said inter-level dielectric film in between via/trenches is etched to form a second set of trenches. These trenches are filled with copper metal and planarized. A third layer of inter-level dielectric film is deposited next and patterned to form via-hole/trenches. Via-hole/trenches are then lined with barrier material, and said inter-level dielectric film between the via-hole/trenches is etched to form a third set of trenches. These trenches are filled with copper metal and excess metal removed by a planarizing process.

Said process results in an inductor device, embedded in a dielectric film and with inductor metal wiring having large cross section. The large cross-section in turn reduces the resistance of the device structure. The inductor can be designed to be of several shapes comprising spiral, polygonal, square, omega shaped, or horseshoe shapes as viewed from the top.

BRIEF DESCRIPTION OF THE DRAWINGS

The objects, advantages, and details of fabricating a semiconductor device according to this invention will be

DETAILED DESCRIPTION OF THE INVENTION

Although the embodiment shown in the accompanying figures and described hereafter describes a copper inductor structure formed within three layers of inter-level dielectric film, the inductor structure can however be formed in more than or less than three layers of inter-level dielectric films.

Figure 1:
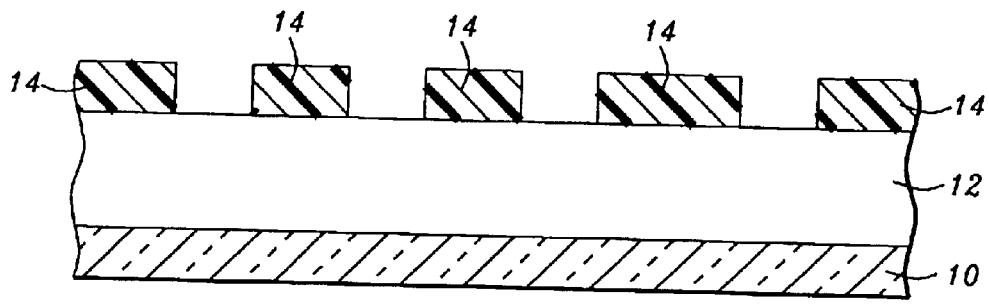
FIG. 1 is a cross-section of the partially formed structure, showing the first trench mask pattern over the first dielectric film.

The process of forming an inductor device begins with depositing a dielectric film 12 over a semiconductor substrate 10, having already formed device elements such as active element like a transistor or passive element such as a capacitor. Said dielectric film is composed of either organic or inorganic materials. Organic type materials compose porous or non-porous polymers such as, poly-tetrafluoro ethylene (PTFE), polyimide, low-k materials like SiLK, (Manufacturer: The Dow Chemical Company, Midland, Mich.), poly arylenes, cyclotenes, and teflons, and/or polyimide nanofoams. The inorganic and hybrid (combination of inorganic and organic components) type materials compose silicon dioxide, nitridized silicon dioxide, silicon nitride, oxygen-doped silicon nitride, silicon oxy-fluoride (SiOF or FSG), spin-on glass (SOG), nanoporous silica, organo-silicate glass (OSG), methyl silsesquioxane (MSQ), hydrogen silses-quioxane (HSQ), and/or silica aerogels. Dielectric film of thickness approximately between 1000 Å–5000 Å is deposited using methods such as chemical vapor deposition (CVD), plasma-enhanced CVD, and/or spin-on process known in prior art. A photo-resist mask pattern 14 is then formed over said dielectric film using processes of lithography known in prior art, as shown in FIG. 1.

Figure 2:
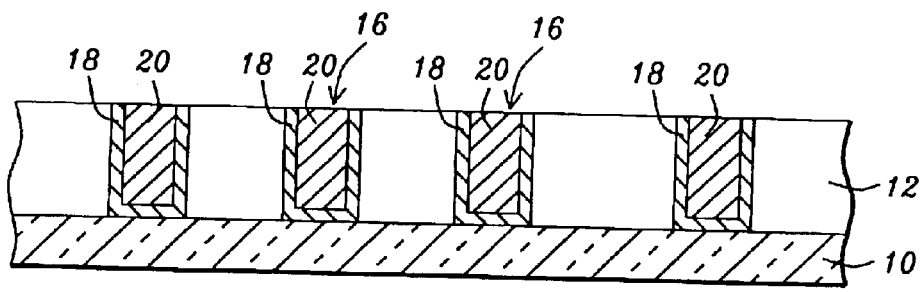
FIG. 2 is a cross-section of the partially formed structure, after the trenches have been etched in the first dielectric film, lined with barrier film, filled with copper metal, and planarized.

Trench patterns 16 are then etched into dielectric film 12. Trench etching is done using a suitable plasma process, known in prior art, that achieves near-vertical profiles in said dielectric film. If the dielectric film is the inorganic type, gases used for plasma etching basically consist of fluorinated gases such as $CF_4$, $CHF_3$, and/or $C_2F_6$ with or without additive gases such as Ar, $O_2$, and/or $N_2$. If organic type dielectric films are used, the gases such as $O_2$, $O_2+N_2$, $O_2+N_2O$ are used. After stripping the resist mask in oxidizing plasma with gases such as $O_2$ or $O_2+N_2O$, the trenches are lined with barrier film 18 with approximate thickness of about 100 A–500 A. Said film is composed of Ta, TaN, and/or TiN and deposited by methods such as collimated sputtering, ionized metal plasma deposition, and/or CVD, know in prior art. Lined trenches are then filled with copper 20, using methods of electroless plating, electrolytic plating, CVD, and/or collimated or ionized metal sputtering known in prior art. Excess copper metal and barrier film on the top surface of said dielectric film is removed by planarization method such as chemical mechanical polishing. The resulting structure after planarization is shown in FIG. 2. Although copper is used in the preferred embodiment, other conductor metals composing aluminum, aluminum-copper alloy, gold, and/or silver can be used.

Figure 3:
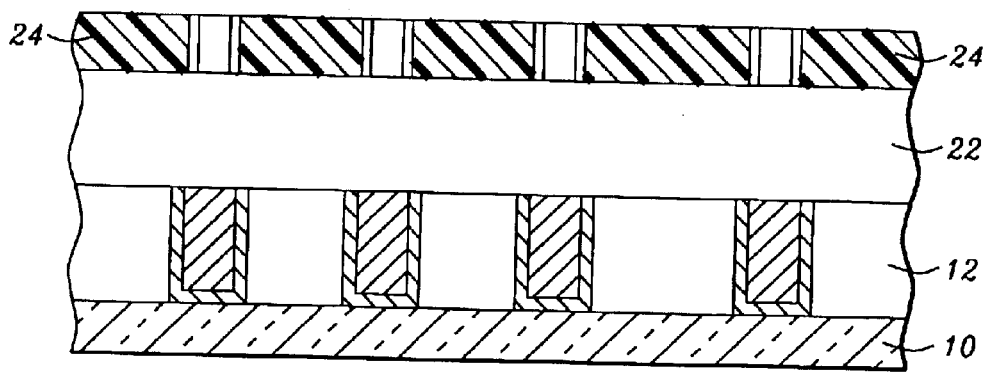
FIG. 3 is a cross-section of the partially formed structure, showing via-hole/trench mask pattern over a second dielectric film.

Second dielectric film 22 is deposited next. Said second dielectric film is composed of either organic or inorganic materials. Organic type materials are composed of porous or non-porous polymers such as, poly-tetrafluoro ethylene (PTFE), polyimide, low-k materials like SiLK, (Manufacturer: The Dow Chemical Company, Midland, Mich.), poly arylenes, cyclotenes, and teflons, and/or polyimide nanofoams. The inorganic and hybrid (combination of inorganic and organic components) type of materials compose silicon dioxide, nitridized silicon dioxide, silicon nitride, oxygen-doped silicon nitride, silicon oxy-fluoride (SiOF or FSG), spin-on glass (SOG), nanoporous silica, organo-silicate glass (OSG), methyl silsesquioxane (MSQ), hydrogen silsesquioxane (HSQ), and/or silica aerogels. Dielectric film of thickness approximately between 1000 Å–5000 Å is deposited using methods such as chemical vapor deposition (CVD), plasma-enhanced CVD, and/or spin-on process known in prior art. A photo-resist mask with via/trench pattern 24 is then formed over said dielectric film using processes of lithography known in prior art, as shown in FIG. 3.

Figure 4:
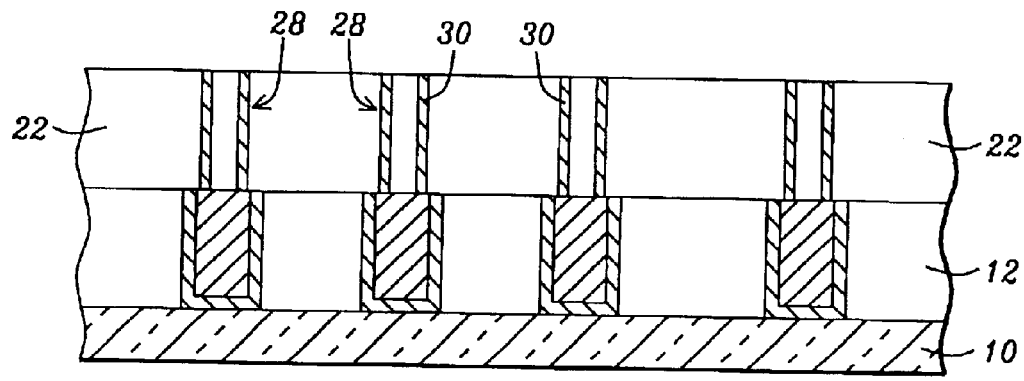
FIG. 4 is a cross-section of the partially formed structure, after via-hole/trenches have been etched in the second dielectric film, filled with barrier metal, and planarized.

Via-hole/trench patterns 28 are then etched in said dielectric film using anisotropic plasma process as shown in FIG. 4. Etch stop on the first dielectric layer is not a problem, since etch stop occurs on the copper film. After stripping the mask, via/trench patterns are then filled with barrier film 30 composed of Ta, TaN, and/or TiN using deposition methods such as collimated sputtering, ionized metal plasma deposition, and/or CVD, know in prior art. Excess barrier film on the top surface of said dielectric film is removed by planarization method such as, chemical mechanical polishing. The resulting structure after planarization is shown in FIG. 4.

A photo-resist mask 32, with second trench pattern, is formed on said second dielectric film. Trenches 34, as shown in FIG. 5, are then etched in said dielectric film, in between barrier-filled via-hole/trenches, using anisotropic plasma process and to stop on the copper film underneath; and the mask is stripped off.

Figure 5:
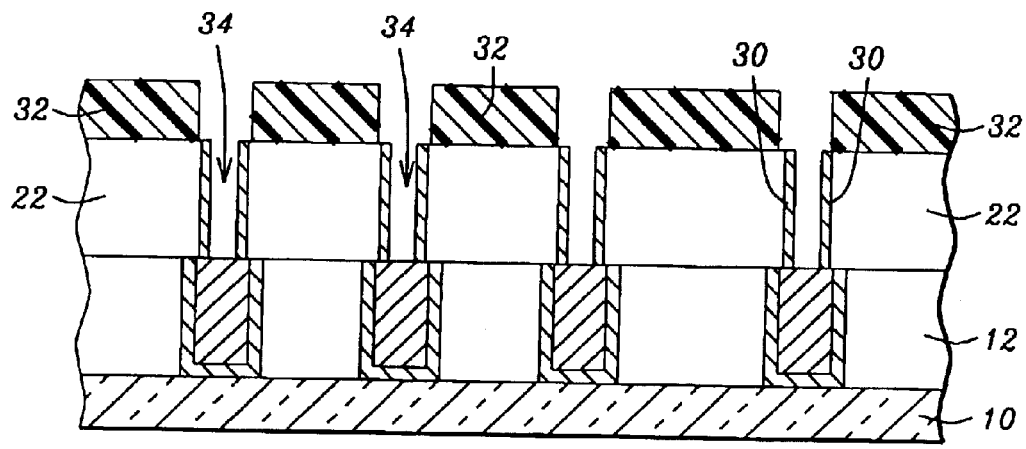
FIG. 5 is a cross-section of the partially formed structure, showing trench mask pattern and trenches etched in the second dielectric film in between the barrier metal structure.
Figure 6:
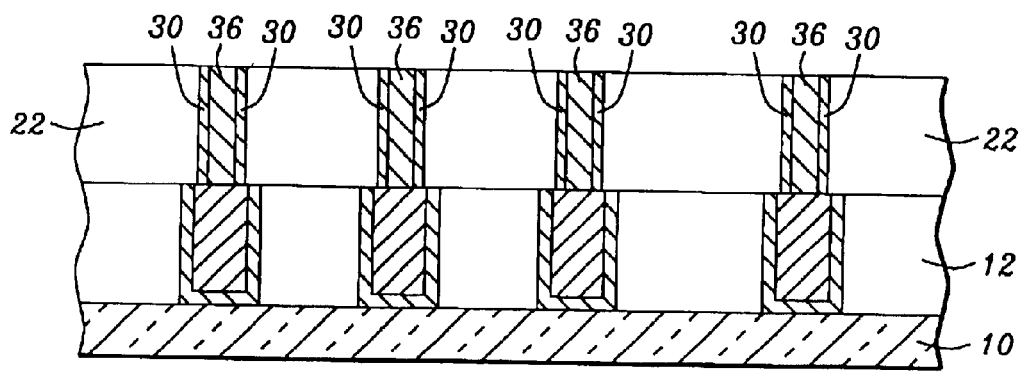
FIG. 6 is a cross-section of the partially formed structure, after filling the trenches in the second dielectric film with copper metal and planarizing excess metal.

FIG. 6 shows the structure in FIG. 5 after filling the trenches with copper 36, using methods of electroless plating, electrolytic plating, CVD, and/or collimated or ionized metal sputtering known in prior art; and planarizing excess copper using chemical mechanical polishing. Although copper is used in the preferred embodiment, other conductor metals composing aluminum, aluminum-copper alloy, gold, and/or silver can be used.

Figure 7:
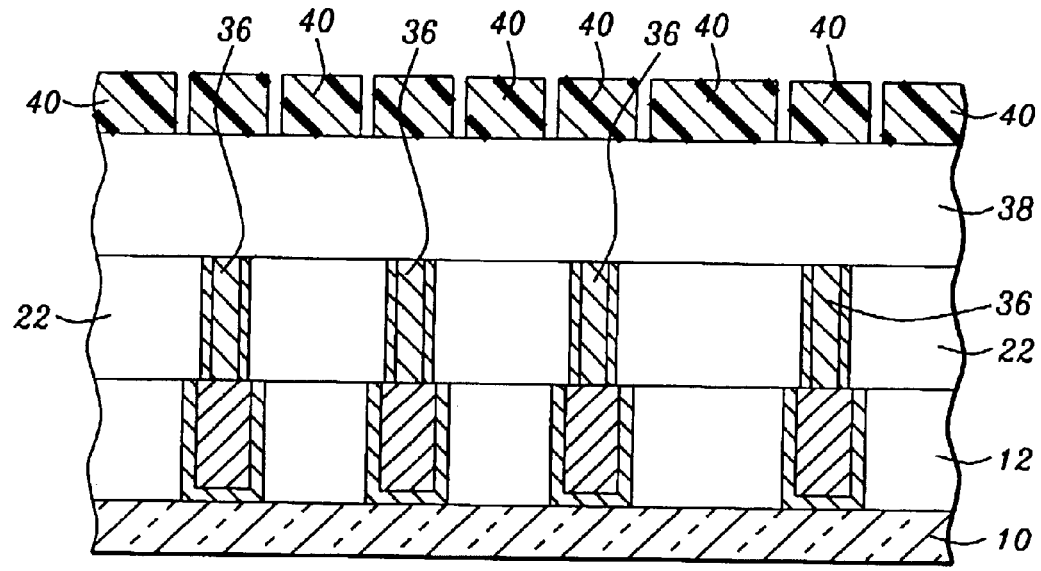
FIG. 7 is a cross-section of the partially formed structure, showing via-hole/trench mask pattern over a third dielectric film.

Third dielectric film 38 is deposited next. Said second dielectric film is composed of either organic or inorganic materials. Organic type materials are composed of porous or non-porous polymers such as, poly-tetrafluoro ethylene (PTFE), polyimide, low-k materials like SiLK, (Manufacturer: The Dow Chemical Company, Midland, Mich.), poly arylenes, cyclotenes, and teflons, and/or polyimide nanofoams. Inorganic and hybrid (combination of inorganic and organic components) type materials compose silicon dioxide, nitridized silicon dioxide, siliconnitride, oxygen-doped silicon nitride, silicon oxy-fluoride (SiOF or FSG), spin-on glass (SOG)nanoporous silica, organosilicate glass (OSG), methyl silsesquioxane (MSQ), hydrogen-hydrogen-silsesquioxane (HSQ), and/or silica aerogels. Dielectric film of thickness approximately between 1000 Å–5000 Å is deposited using methods such as, chemical vapor deposition (CVD), plasma-enhanced CVD, and/or spin-on process known in prior art. A photo-resist mask pattern 40 for forming via/trenches is then formed over said dielectric film using processes of lithography known in prior art, as shown in FIG. 7.

Figure 8:
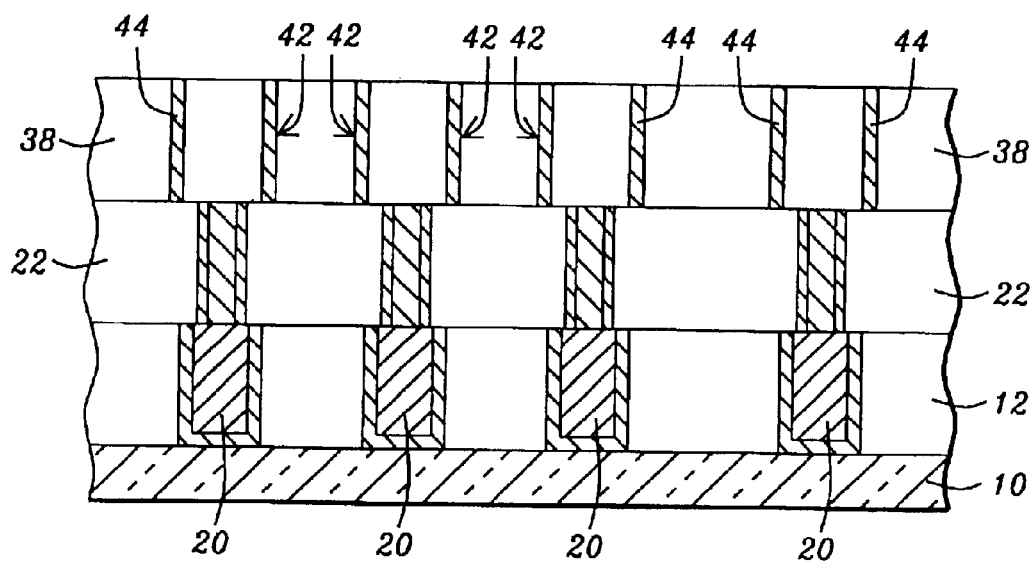
FIG. 8 is a cross-section of the partially formed structure, after via/trenches have been etched in the second dielectric film, filled with barrier metal, and planarized.

Via/trench patterns 42 are then etched in said third dielectric film using anisotropic plasma process. Since via-hole/trench pattern falls outside the metal pattern underneath, there is no etch stop to stop on the second dielectric layer. This necessitates precise control of the etching process. Alternatively, a film which offers etch stop capability to the plasma used for etching said third dielectric film can be deposited prior to depositing said third dielectric film. After stripping the mask, via-hole/trench patterns are then filled with barrier material 44 composed of Ta, TaN, and/or TiN using deposition methods such as collimated sputtering, ionized metal plasma deposition, and/or CVD, know in prior art. Excess barrier film on the top surface of said dielectric film is removed by planarization method such as chemical mechanical polishing. The resulting structure after planarization is shown in FIG. 8.

Figure 9:
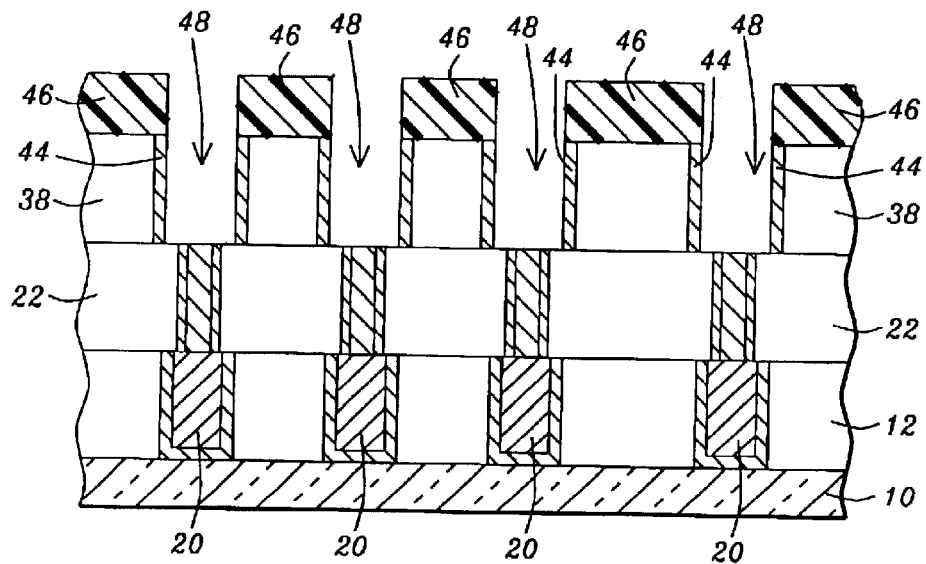
FIG. 9 is a cross-section of the partially formed structure, showing trench mask pattern and trenches etched in the third dielectric film in between the barrier metal structure.

A photo-resist mask 46, with second trench pattern is formed on said second dielectric film. Trenches 48, as shown in FIG. 9, are then etched in said third dielectric film, in between barrier material-filled via-hole/trenches, using anisotropic plasma process. Etch time is critical since the trenches have to stop on second dielectric film, unless an etch stop layer has been provided. The mask is then stripped off.

Figure 10:
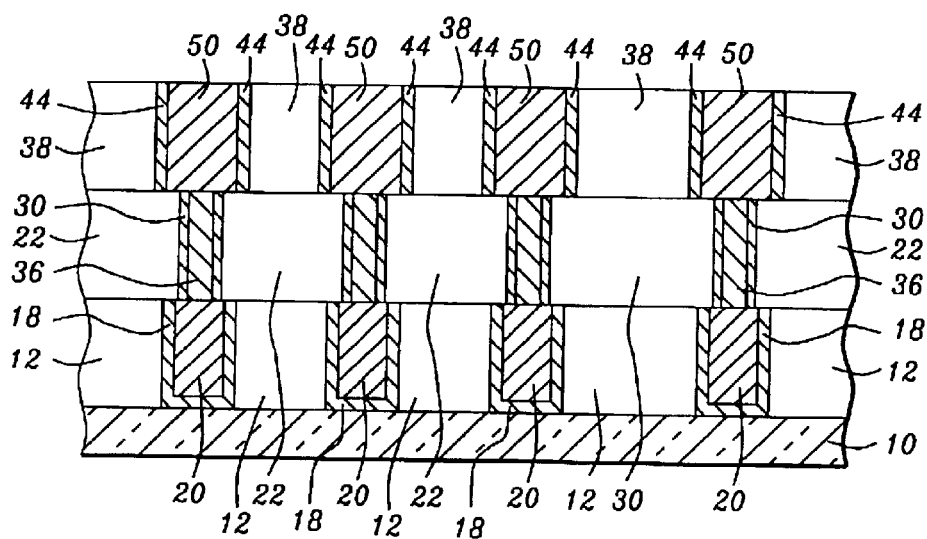
FIG. 10 is a cross-section of the fully formed inductor, after filling the trenches in the second dielectric film with copper metal and planarizing excess metal.
Figure 11A:
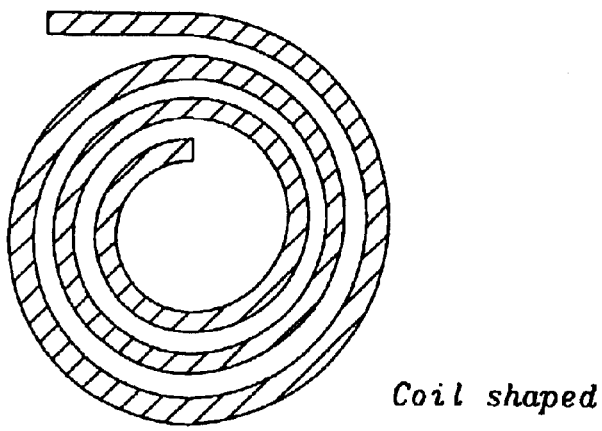
FIG. 11a, 11b, 11c show three of the possible shapes of inductors, as viewed from the top: round coil or spiral (FIG. 11a), omega (FIG. 11b), and square coil or spiral (FIG. 11c), that can be fabricated with the inventions process.
Figure 11B:
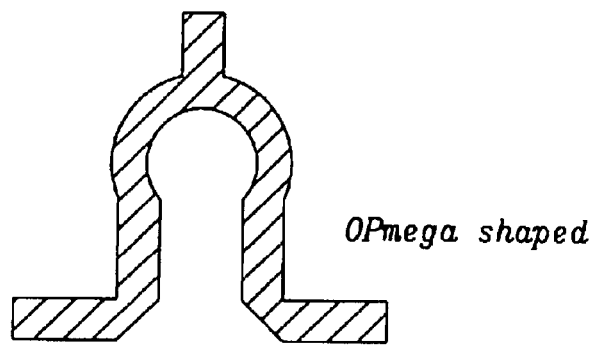
Figure 11C:
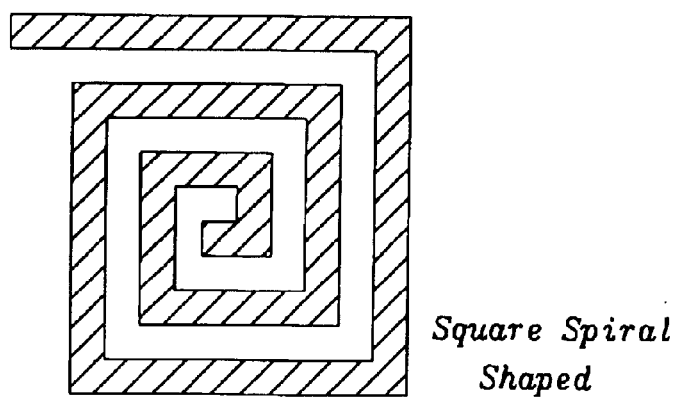

Lined trenches are then filled with copper 50, using methods of electroless plating, electrolytic plating, CVD, and/or collimated or ionized metal sputtering known in prior art. Excess copper metal and barrier film on the top surface of said dielectric film is removed by planarization method such as chemical mechanical polishing. The resulting inductor structure after planarization is shown in FIG. 10. Although copper is used in the preferred embodiment, other conductor metals composing aluminum, aluminum-copper alloy, gold, and/or silver can be used.

The advantages of this invention over prior art are:

a) inductor structure with large metal cross-section, providing a lower wire resistance, b) continuous metal deposition scheme without any interfaces causing contact resistance problems, c) potential for using different dielectric materials for the different layers, providing additional control over the performance of the device.

While the invention has been particularly shown and described with reference to the general embodiment and a specific application thereof, it will be understood by those skilled in the art that various changes in form and details to the method and applications may be made without departing from the concept, spirit, and the scope of the invention.

What is claimed is:

1. A method of forming a monolithic inductor, the steps comprising:

forming a first dielectric layer on a semiconductor substrate having device components;

forming first trenches in said first dielectric layer;

forming first barrier material liner on said first trench walls;

filling said first trenches with first metal and planarizing said first metal;

forming a second dielectric layer over said first dielectric film having filled first trenches;

forming first via-trench patterns in said second dielectric layer;

filling said first via-trench patterns with second barrier material and planarizing said second barrier material;

forming second trenches in said second dielectric layer between said second barrier material filled first via-trenches;

filling said second trenches with second metal and planarizing said second metal;

forming a third dielectric layer over said second dielectric film having second metal filled second trenches;

forming second via-trench patterns in said third dielectric layer;

filling said second via-trench patterns with third barrier material and planarizing said third barrier material;

forming third trenches in said second dielectric layer between said third barrier metal filled second via-trenches; and filling said third trenches with third metal and planarizing said third metal.

2. The method of forming a monolithic inductor according to claim 1, wherein said first dielectric film is comprises poly-tetrafluoro ethylene, polyimide, poly-arylenes, cyclotenes, teflons, and/or polyimide nanofoams.

3. The method of forming a monolithic inductor according to claim 1, wherein said first dielectric film comprises silicon dioxide, nitridized silicon dioxide, silicon nitride, oxygen-doped silicon nitride, silicon oxy-fluoride, spin-on glass, nanoporous silica, organo-silicate glass, methyl silsesquioxane, hydrogen silsesquioxane, and/or silica aerogels.

4. The method of forming a monolithic inductor according to claim 1, wherein said first dielectric film has a thickness of approximately between 1000 Å–5000 Å.

5. The method of forming a monolithic inductor according to claim 1, wherein said first barrier material comprises Ta, TaN, and/or TiN.

6. The method of forming a monolithic inductor according to claim 5, wherein said first barrier material liner thickness is approximately between 100 Å–500 Å.

7. The method of forming a monolithic inductor according to claim 1, wherein said first, metal comprises aluminum, copper, aluminum-copper alloy, gold, and/or silver.

8. The method of forming a monolithic inductor according to claim 1, wherein said second dielectric film comprises poly-tetrafluoro ethylene, polyimide, poly arylenes, cyclotenes, and teflons, and/or polyimide nanofoams.

9. The method of forming a monolithic inductor according to claim 1, wherein said second dielectric film comprises silicon dioxide, nitridized silicon dioxide, silicon nitride, oxygen-doped silicon nitride, silicon oxy-fluoride, spin-on glass, nanoporous silica, organo-silicate glass, methyl silsesquioxane, hydrogen silsesquioxane, and/or silica aerogels.

10. The method of forming a monolithic inductor according to claim 1, wherein said second dielectric film has a thickness of approximately between 1000 Å–5000 Å.

11. The method of forming a monolithic inductor according to claim 1, wherein said second barrier material comprises Ta, TaN, and/or TiN.

12. The method of forming a monolithic inductor according to claim 1, wherein said second metal comprises aluminum, copper, aluminum-copper alloy, gold, and/or silver.

13. The method of forming a monolithic inductor according to claim 1, wherein said third dielectric film comprises poly-tetrafluoro ethylene, polyimide, poly arylenes, cyclotenes, and teflons, and/or polyimide nanofoams.

14. The method of forming a monolithic inductor according to claim 1, wherein said third dielectric film comprises silicon dioxide, nitridized silicon dioxide, silicon nitride, oxygen doped silicon nitride, silicon oxy-fluoride, spin-on glass, nanoporous silica, organo-silicate glass, methyl silsesquioxane, hydrogen silsesquioxane, and/or silica aerogels.

15. The method of forming a monolithic inductor according to claim 1, wherein said third dielectric film has a thickness of approximately between 1000 Å–5000 Å.

16. The method of forming a monolithic inductor according to claim 1, wherein said third barrier material comprises Ta, TaN, and/or TiN.

17. The method of forming a monolithic inductor according to claim 1, wherein said third metal comprises aluminum, copper, aluminum-copper alloy, gold, and/or silver.

* * * * *